United States Patent [19]

Capasso et al.

[11] Patent Number: 4,694,318
[45] Date of Patent: Sep. 15, 1987

[54] SAWTOOTH PHOTODETECTOR

[75] Inventors: Federico Capasso, Westfield; Won-Tien Tsang, New Providence, both of N.J.

[73] Assignee: American Telephone and Telegraph Company, AT&T Bell Laboratories, Murray Hill, N.J.

[21] Appl. No.: 678,226

[22] Filed: Dec. 5, 1984

[51] Int. Cl.[4] ...................... H01L 27/14; H01L 31/00
[52] U.S. Cl. .......................................... 357/30; 357/4; 357/16; 357/90
[58] Field of Search ................... 357/30, 16, 4, 13, 90, 357/

[56] References Cited

U.S. PATENT DOCUMENTS

| 4,353,081 | 10/1982 | Allyn et al. | 357/16 |
| 4,383,269 | 5/1983 | Capasso | 357/30 |
| 4,476,477 | 10/1984 | Capasso et al. | 357/30 |
| 4,486,765 | 12/1984 | Capasso | 357/30 |
| 4,590,507 | 5/1986 | Capasso et al. | 357/30 |

OTHER PUBLICATIONS

"Enhancement of Electron Impact Ionization in a Superlattice: A New Avalanche Photodiode with a Large Ionization Rate Ratio", *Applied Physics Letters,* 40(1), Capasso et al., (1982) pp. 38–40.
"Staircase Solid-State Photomultipliers and Avalanche Photodiodes with Enhanced Ionization Rates Ratio", *IEEE Transactions on Electron Devices,* vol. ED-30, No. 4, Capasso et al., (1983) pp. 381–390.
"Planar-Doped Barriers in GaAs by Molecular Beam Epitaxy", *Electronics Letters,* vol. 16, No. 22, Malik et al., (1980) pp. 836–837.

Primary Examiner—James W. Davie
Assistant Examiner—Georgia Y. Epps
Attorney, Agent, or Firm—Peter A. Businger; Richard D. Laumann

[57] ABSTRACT

A structure having a sawtooth graded bandgap region between two layers having the same conductivity type is useful as a photodetector.

11 Claims, 6 Drawing Figures

SAWTOOTH PHOTODETECTOR

TECHNICAL FIELD

This invention relates generally to photodetectors and particularly to photodetectors having varying bandgap regions.

BACKGROUND OF THE INVENTION

Many technological applications today use semiconductor devices. These devices are the product of extensive research and development efforts in many areas including such areas as semiconductor epitaxial growth and device design. Many devices use only a single semiconductor material, for example, silicon, which may be used to fabricate a variety of devices including transistors, photodetectors, etc.

Devices have also been proposed which use several semiconductor materials having different bandgaps. One such device is the heterojunction bipolar transistor first disclosed by Shockley. More recently, devices have been developed which have pluralities of interleaved layers with different energy bandgaps to obtain desirable device characteristics. Such devices include, for example, multi-quantum well and superlattice structures. These structures are useful in many type of diverse devices including light sources and detectors as well as devices exhibiting negative differential conductivity. See, for example, *Applied Physics Letters*, 40, pp. 38–40, January 1982, which describes a superlattice photodiode. In these structures, the energy bandgap typically varies from layer to layer but is relatively constant within any given layer.

Still more recently, devices have also been proposed and developed having a graded energy bandgap within a layer, i.e., the bandgap within a layer varies as the, e.g., composition or doping concentration varies. See, for example, U.S. Pat. No. 4,383,269 issued on May 10, 1983 to Federico Capasso which describes an avalanche photodetector having a graded bandgap that enhances the ionization rate of one type of carrier with respect to the other type of carrier. Another such structure, which may be termed a sawtooth structure, may be used as a rectifier. Yet another structure, termed a staircase, when suitably biased, is useful as a semiconductor photodetector which is the solid state analog of a photomultiplier. See, for example, *IEEE Transactions on Electron Devices*, ED-30, pp. 381–390, April 1983. A sawtooth or staircase structure has an energy bandgap that increases monotonically, within a layer, from a lower value to a higher value followed by a stepback to a lower value at the interface with the next layer. When the change, i.e., stepback, in the energy bandgap is sufficiently large in the staircase, at least one type of carrier acquires sufficient energy to impact ionize. The term sawtooth or staircase thus refers to the energy bandgap structure. The graded bandgap layer, or layers, is sandwiched between two epitaxial layers which have the same and opposite conductivity types for the rectifier and photodetector, respectively. When used as a rectifier, the two epitaxial layers have a relatively narrow bandgap as compared to the graded layer. For the rectifier application, a bias voltage must be applied. See, e.g., U.S. Pat. No. 4,353,081 issued on Oct. 5, 1982 to Allyn, Gossard and Wiegmann.

A device using relatively thin highly doped layers to obtain a triangular barrier is described in *Electronics Letters*, 16, pp. 836–838, Oct. 23, 1980. The resulting majority carrier device was stated to be useful as a rectifying device and as a mixer diode.

SUMMARY OF THE INVENTION

We have found that a structure comprising first and second layers and a plurality of varying field layers between said first and second layers may be used as a photodetector at zero bias. The varying field may be an electric field or a quasi-electric field. The first and second layers have a first conductivity type. The varying electric field layers have a structure, for example, a well, in at least one of the energy bands such that one type of photogenerated carrier is trapped in an energy well formed by, for example, an energy band discontinuity. That is, the discontinuity forms an energy well. The discontinuity may be in either the valence or conduction bands and may be produced by compositional or doping variations in the layer. A transient macroscopic electrical polarization and a photovoltage across the device terminals are produced, upon illumination, without the requirement of an external bias. The bandgaps of the first and second layers, in one preferred embodiment, are at least as large as the greatest bandgap of the varying bandgap layers. In a further preferred embodiment, the varying field is produced by a varying bandgap. The varying bandgap produces a quasi-electric field, due to the gradient of the energy band, which acts on the carriers. It is termed a quasi-field becaue carriers of opposite sign can move in the same direction.

DETAILED DESCRIPTION

Figure 1:
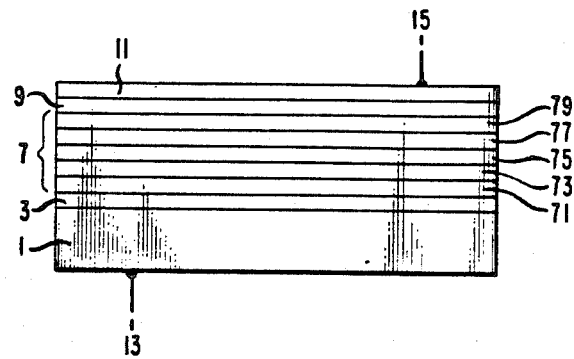
FIG. 1 is an endview of an embodiment of a photodetector according to our invention.

Our invention will be first discussed by reference to the embodiment of a photodetector according to our invention shown in endview in FIG. 1. This embodiment uses graded bandgap layers. Other embodiments will be discussed and still others will be apparent to those skilled in the art after our description. For reasons of clarity, the elements of the device are not drawn to scale.

The device comprises substrate 1, first epitaxial layer 3, graded bandgap region 5 comprising a plurality of layers indicated generally as 7, second epitaxial layer 9, and contact layer 11. The first and second epitaxial layers have the first conductivity type and a bandgap, in a preferred embodiment, at least as great as the smallest bandgap in the graded bandgap region. The graded bandgap region 7 is a region comprising a plurality of graded bandgap layers 71, 73, 75, 77 and 79. Each layer has a varying energy bandgap and the first conductivity type or is nominally undoped. Of course, more or fewer layers than depicted may be used in the graded bandgap region. A portion of at least one graded bandgap layer should have a bandgap less than the energy of the incident photons so that radiation is absorbed. Substrate 1 and contact layer 11 are contacted by electrical contacts 13 and 15, respectively.

Figure 2:
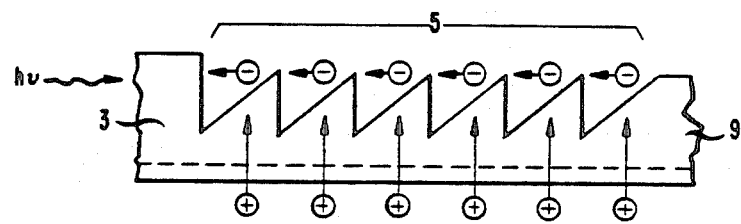
FIG. 2 is the energy band diagram for the embodiment depicted in FIG. 1.

The energy band structure of the device depicted in FIG. 1 is shown in FIG. 2. The incident light is depicted as hν and the photogenerated electrons and holes as the minus and plus, respectively, signs within the circles. The first conductivity type is p-type and the Fermi level is shown by the dashed line.

There will generally be discontinuities in both the valence and conduction bands although FIG. 2 shows a flat valence band. These discontinuities will be referred to as $\Delta E_v$ and $\Delta E_c$, respectively. For $\Delta E_c$ greater than and less than $\Delta E_v$, respectively, the preferred first conductivity types are p-type and n-type, respectively.

In one embodiment of the device depicted in FIG. 1, the buffer, i.e., first epitaxial, layer comprised p-type GaAs approximately 1.0 μm thick doped with Be to a density of $5 \times 10^{18} cm^{-3}$. The substrate was Zn-doped GaAs. The multilayer graded bandgap region comprised layers graded from GaAs to $Al_{0.2}Ga_{0.8}As$. The grading period was approximately 500 Angstroms with an abrupt stepback at the end of the period, i.e., at the interface with the next layer. The graded bandgap layers were doped with Be to a value in the concentration range between $10^{15}$ and $10^{17}/cm^3$. The contact layer was heavily doped GaAs approximately 700 Angstroms thick grown on top of the $Al_{0.45}Ga_{0.55}As$ 1 μm thick window, i.e., second epitaxial, layer. The heavily doped contact layer facilitates the formation of ohmic contacts. A typical device had an area of approximately $2.7 \times 10^{-4} cm^2$.

The graded bandgap region and the epitaxial layers are conveniently grown by well-known growth techniques such as molecular beam epitaxy (MBE). The compositional grading of the layers was not easily achieved by simply ramping the temperature of the Al or Ga ovens. Rather, the unidirectional compositional grading was easily obtained by controlling the speed with which the shutter closed the orifice of the Al effusion cell while maintaining the oven temperature constant. The Al flux intensity arriving at the substrate surface depended on the size of the Al orifice. The abrupt compositional stepback at the end of the period was obtained by closing the Al cell abruptly while the graded portion was obtained by closing the cell with discrete steps. Ring-shaped ohmic contacts were applied to the top and bottom of the structure by alloying plated AuZn. The portion of thin highly doped GaAs contact layer not covered by the metallization was removed by a selective etch and devices were defined by mesa etching. Other growth techniques, as well as other compositions, may be used.

Alternatively, the graded bandgap regions may be grown by MBE using the chopped beam technique. With this technique, the beam from at least one of the ovens is turned off and on by moving a shutter in front of an away from the oven opening. The thicknesses and compositions of the graded regions are controlled by controlling the opening and closing of a shutter in front of at least one of the effusion ovens. For example, the shutter in front of an Al effusion cell may be used to chop the Al beam and grow alternating GaAs and AlGaAs layers. Thus, the graded region comprises a first plurality of layers of a first compound semiconductor interleaved with a second plurality of a second compound semiconductor. The average composition of a series of epitaxial layers is equal to the desired graded composition. It will be readily appreciated that the compositions of the first and second pluralities change to accomplish the grading. This is accomplished by varying the time the shutter is open, i.e., the duty cycle. For example, in a graded bandgap AlGaAs/GaAs region, twenty successive bilayers will have progressively thicker or thinner AlGaAs sections and correspondingly thinner or thicker GaAs sections as the aluminum concentration increases or decreases.

Layer thicknesses are typically within the range between several hundred and several thousand Angstroms. Suitable materials may be selected from the group consisting of Group II-VI and III-V compound semiconductors such as HgCdTe, $Al_xGa_{1-x}As$, AlInAs and InGaAsP. The thicknesses of the graded bandgap regions should be less than the carrier tunneling distance to ensure confinement of carriers within the energy wells.

Figure 3:
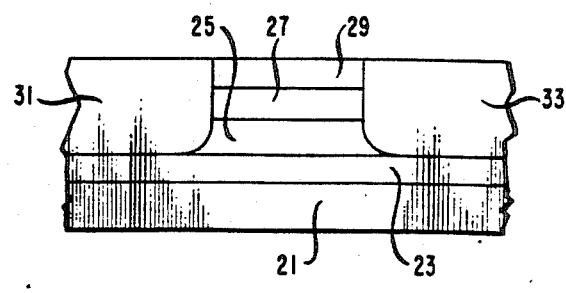
FIG. 3 is an endview of another embodiment of a photodetector according to our invention.

Another embodiment of a photodetector according to our invention is depicted in end view in FIG. 3. The photodetector comprises substrate 21, buffer layer 23, and a triangular barrier region comprising at least one n-i-p structure. Only one n-i-p structure is depicted. More may be present. Each n-i-p structure has a first layer 25 having a first conductivity type, a second layer 27 having intrinsic conductivity, and a third layer 29 having a second conductivity type. There are also first and second contact regions 31 and 33 having first and second conductivity types, respectively. These regions will also be termed third and fourth regions. Layers 25 and 29 form thin conducting fingers between the contact regions. Regions 31 and 33 contact the thin conducting fingers 25 and 29. It will also now be appreciated that the embodiment described specifically with respect to FIG. 1 may also be fabricated with a n-i-p structure instead of the graded bandgap layers. The n-i-p structure has a varying potential. Alternatively, the graded bandgap structure of FIG. 2 may be substituted for the n-i-p structure.

Figure 4:
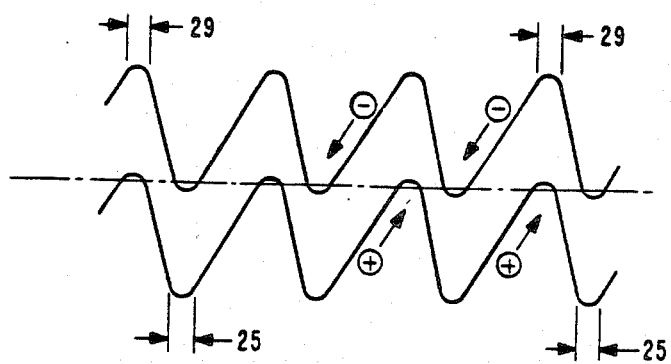
FIG. 4 is the energy band diagram for the embodiment depicted in FIG. 3.

Layers 25 and 29 are doped to produce the energy band diagram for several n-i-p structures depicted in FIG. 4. The n, i and p layers are indicated for several triangular barrier regions with the n and p layers being indicated as 25 and 29, respectively, and the i layers being between the n and p layers. The term i is used to mean that the layers are not intentionally doped and have a background doping concentration less than approximately $10^{16}/cm^3$. The free carrier concentrations in layers 25 and 29 are such that the bottom of the conduction band and top of the valence band are below and above, respectively, the Fermi level which is indicated as $E_F$. The photogenerated carriers move as indicated by the arrows.

This device may be fabricated by well-known growth techniques followed by conventional diffusion implantation techniques or epitaxial regrowth techniques to form the contact regions. The semiconductors may be selected from the group consisting of Group II-VI or Group III-V compound semiconductors.

Figure 5:
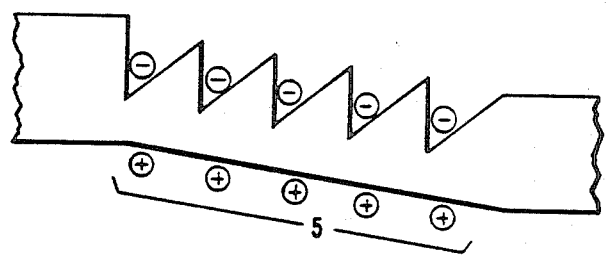
FIGS. 5–6 illustrate the formation and decay of the macroscopic electrical polarization in a photodetector according to our invention.
Figure 6:
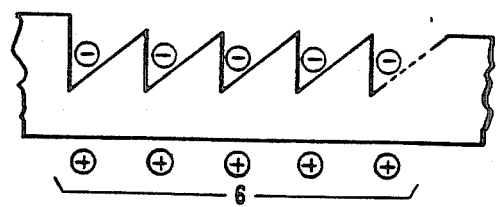

The operation of the device depicted in FIG. 1 will be better understood by reference to FIGS. 2 and 5-6. Light is incident on the photodetector as indicated by the arrow in FIG. 2 and when photons are absorbed, electron hole pairs, the electrons and holes are represented by the minus and plus signs, respectively, within the circles, are created as shown in FIG. 2. The electrons are subject to a relatively high electric field due to the energy bandgap grading and move as indicated by the arrows whereas the total force acting on the holes is essentially negligible because of the valence band edge line-up in the p-type materials, i.e., regions 3 and 9. It is thus desirable that any discontinuity in the valence band be as small as possible so that the holes have a small force acting on them. Consequently, electrons separate from the holes and reach the low energy gap side in a relatively small time. This time, as will be discussed later, may be less than a picosecond. An electrical polarization appears in the sawtooth structure and causes a voltage to appear across the device terminals as depicted in FIG. 5. In other words, there is a macroscopic dipole moment. It should be emphasized, however, that no external bias need be applied.

The macroscopic dipole moment and the resulting photovoltage decay by the combination of at least two effects. First, there is dielectric relaxation and second, there is hole drift under the action of the internal electric field produced by the separation of the electrons and holes. Dielectric relaxation is the process by which the charge packets decay to neutrality. The excess hole density decays by dielectric relaxation to restore a flat valence band condition as depicted in FIG. 6. It should be noted that in this configuration, holes have redistributed themselves to neutralize the electrons at the bottom of the energy wells. Thus, the net negative charge density on the low energy gap side of the well has also decreased with the same time constant as has the positive charge packet. The holes drift because of the electric field created by the initial spatial separation of the charge carriers. A charge packet comprising holes drifts toward an electron charge packet. The physical picture may be visualized as being two charge packets of opposite sign having densities that decrease with time because of dielectric relaxation and a separation which decreases because of hole drift.

The output voltage is also a function of time and can be approximately represented by equation (1):

$$v(t) = N\sigma(t)d(t)/\epsilon \qquad (1)$$

where N is the number of layers, $\sigma$ is the charge density of the layers, d is the separation of the charge packets and $\epsilon$ is the dielectric constant. This approximation is not completely accurate in practice as the excitation of the charge carriers will be spatially nonuniform rather than uniform as assumed. That is, the values of $\sigma$ need not be the same in all layers. It is also assumed that all layers are essentially identical. Different grading in the layers will produce values of d that vary from layer to layer. As will be readily appreciated, the case of nonuniform excitation can be analyzed by treating $\sigma$ as a position-dependent variable. However, the assumptions are made in the belief that the device operation is easily understood with these assumptions and that after this approximate representation is understood, more complicated representations will also be understood. For a time which is much longer than the characteristic drift time, the voltage is given by equation (2):

$$v(t) = N\sigma_o d_o(1 - t/t_d)/\epsilon. \qquad (2)$$

For times much less than the characteristic drift time, the output voltage is given by equation (3):

$$v(t) = N\sigma_o d_o \exp(-t/\tau_m)/\epsilon. \qquad (3)$$

For the latter case, the photodetector behaves as a parallel plate capacitor which discharges through a leakage resistor having a resistance proportional to 1/s where 1 is the thickness of the graded bandgap area and s is the device area, i.e., the area of the mesa. It should be noted that the RC time constant of this capacitor is simply the dielectric relaxation time. When an external load resistor is added, the decay time of the photovoltage is not only due to the above mechanism but also to the charge redistribution between the capacitor's terminals via the external load.

As previously mentioned, the peak voltage depends upon the number of layers, the charge injected and the layer thickness. A typical injected carrier density would be in the range between $10^{10}/cm^2$ and $10^{11}/cm^2$. For five layers having a thickness of 500 Angstroms each, the maximum voltage obtained is between 30 mV and 300 mV.

The dielectric relaxation time in the mobility regime varies from 100 psec to 500 psec for doping concentrations between $10^{14}/cm^3$ and $10^{17}/cm^3$. At sufficiently high injected carrier densities, equation (3) is no longer valid because the mobility regime assumption is no longer valid. In the saturated drift velocity limit, there is no dielectric relaxation and the photovoltage decays exclusively through the drift mechanism. Thus, the characteristic time scale of the transient polarization, and thus the output voltage, can be widely varied by changing the doping level and the injected charge density.

It should be pointed out that minority carrier lifetime plays no role in the transient polarization phenomenon. This is easily understood by considering that the recombination of the electron with a hole clearly does not change the charge density or the separation of the charge packets and thus leaves the photovoltage unchanged. The lifetime effects may manifest themselves through luminescence especially from various time separation between repetitive light pulses.

EXAMPLE

The devices were illuminated by a mode locked dye laser having a pulse width of approximately 4 psec and a repetition rate of 86 MHz. The wavelength, approximately 6400 Angstroms, was chosen so that the radiation would pass through the window layer. The absorption length was estimated to be approximately 3500 Angstroms from absorption measurements in $Al_x Ga_{1-x} As$ alloys. The peak power was approximately 1 watt. It was found that the fall time was sensitive to both the laser power and to the background doping. The particular pulse responses obtained cannot be quantitatively compared to equation (2) because the charge density is position-dependent due to the nonuniform optical excitation of the device. It is also noted that in the layers having the highest charge density, the internal electric field due to the polarization may be large and that space charge effects may be present. Consequently, the dielectric relaxation time becomes significantly longer than it is in the mobility regime, and is dependent on the charge density and thus on the position within the device. The problem is more difficult to treat because it becomes highly nonlinear.

The operation of the device depicted in FIG. 3 is more particularly understood from the following considerations. The photogenerated carriers move rapidly to the highly doped n and p layers which have high conductivity. These layers act essentially as ohmic contacts to the i layer. The device operates at high speed. It should be noted that the device has high quantum efficiency because there are many absorbing layers.

What is claimed is:

1. In a photodetector comprising first and second substrate-supported regions, said first and second regions having a first conductivity type,
   a plurality of varying field regions between said first and second regions, said first and second regions having a bandgap at least as great as the smallest bandgap in said varying field region, and
   first and second electrical contacts to said first and second regions, respectively.

2. A photodetector as recited in claim 1 in which said varying field regions comprise graded bandgap regions.

3. A photodetector as recited in claim 2 in which said graded bandgap regions are graded from a first and lower bandgap value to a second and higher bandgap value.

4. A photodetector as recited in claim 3 in which said graded bandgap regions are compositionally graded.

5. A photodetector as recited in claim 4 in which said first conductivity type is p-type.

6. A photodetector as recited in claim 4 in which said first conductivity type is n-type.

7. A photodetector as recited in claim 6 further comprising third and fourth regions, said regions having first and second conductivity types, respectively, and contacting said plurality of regions.

8. A photodetector as recited in claim 1 in which said regions comprise semiconductors selected from the group consisting of Group II–VI and Group III–V compound semiconductors.

9. A photodetector as recited in claim 1 in which said varying field regions comprise first and second doped regions of opposite conductivity types.

10. A photodetector as recited in claim 9 further comprising third and fourth regions, said regions having first and second conductivity types, respectively, and contacting said plurality of regions.

11. A photodetector as recited in claim 10 further comprising an intrinsic conductivity region contacting said first and second doped regions.

* * * * *